United States Patent [19]

Robson et al.

[11] 4,349,783
[45] Sep. 14, 1982

[54] GROUND ISOLATED ELECTROSTATIC FIELD DETECTOR

[76] Inventors: William F. Robson, St. Andrews West, Ontario; Raymond A. Laperle, Boisvenue Dr., R.R. #1, Cornwall, Ontario, both of Canada

[21] Appl. No.: 906,774

[22] Filed: May 17, 1978

[30] Foreign Application Priority Data

Feb. 16, 1978 [CA] Canada ................................. 297050

[51] Int. Cl.³ .................... G01R 5/28; G01R 31/08
[52] U.S. Cl. ................................ 324/457; 324/52; 324/133
[58] Field of Search ................. 324/32, 52, 33, 72, 324/96

[56] References Cited

U.S. PATENT DOCUMENTS

| | | | |
|---|---|---|---|
| 2,615,969 | 10/1952 | Albrecht | 324/133 |
| 3,309,690 | 3/1967 | Moffitt | 324/72 |
| 3,482,235 | 12/1969 | Johnson | 324/133 |
| 3,786,468 | 1/1974 | Moffitt | 324/133 |
| 3,828,256 | 8/1974 | Liu | 324/133 |
| 3,927,571 | 12/1975 | Athey | 324/96 |
| 3,987,392 | 10/1976 | Kugelmann et al. | 324/96 |

FOREIGN PATENT DOCUMENTS

| | | | |
|---|---|---|---|
| 1012607 | 6/1977 | Canada | 324/32 |
| 1166977 | 10/1969 | United Kingdom | |
| 1845491 | 3/1970 | United Kingdom | |
| 1298163 | 11/1972 | United Kingdom | |
| 1367641 | 9/1974 | United Kingdom | |
| 1392081 | 4/1975 | United Kingdom | |
| 1450647 | 9/1976 | United Kingdom | |

Primary Examiner—Gerard R. Strecker
Assistant Examiner—W. Snow
Attorney, Agent, or Firm—Craig and Antonelli

[57] ABSTRACT

An instrument for locating the position of hidden live continuous or broken wires utilizes an indicator such as a series of light emitting diodes to indicate the adjacency or the strength of the electrostatic field surrounding the wire. By watching the number of light emitting diodes lit, the instrument can be brought directly to the wire. The instrument is comprised of an antenna connected to the high input impedance of an amplifier, a low pass filter connected to the output of the amplifier, a lamp operation circuit and an indication means connected to the lamp operation circuit.

9 Claims, 6 Drawing Figures

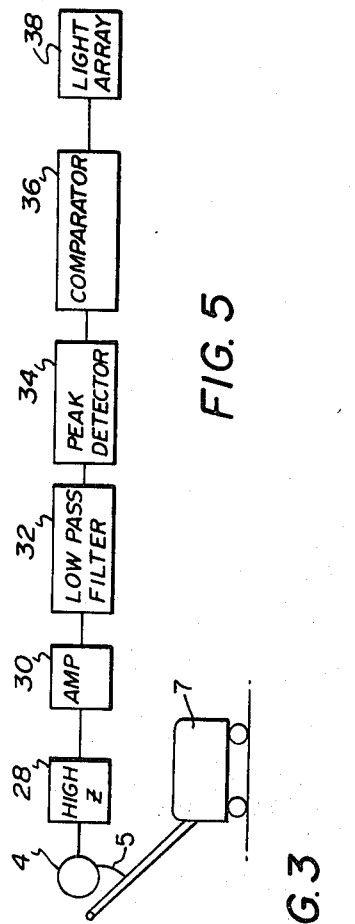

GROUND ISOLATED ELECTROSTATIC FIELD DETECTOR

This invention relates to a novel instrument which is particularly useful for locating live broken electrical conductors, and also other sources of A.C. electrostatic fields.

Where mains or other power supply conductors located within building walls or the like have broken, or must be avoided, a repairman is often called to locate the position of the break and to make an appropriate repair. If the location of the break can be estimated closely, the repairman is able to open the wall immediately adjacent the break; otherwise he is required to tear the entire side of the wall down to locate the position of the wire and trace its location. To locate the break itself within the wire, insulation must be pierced at sequential locations. Sometimes the entire wire must be replaced if the break is difficult to find. Clearly this is a formidable time-consuming and costly task. While the frequency of such breaks are low, they sometimes occur in areas subject to vibration, particularly in older homes in which the conductors have become brittle. Knowledge of the location of a wire is important prior to cutting into a wall, for example for construction modification, addition of plumbing, etc.

In addition, where multiple phase supply lines are used, it is also often difficult to detect which phase may have become inoperative.

The present invention is an instrument which is directed to solving the problem of locating such a live wire, whether or not it is carrying current. It provides, completely contained in a hand-held case, an antenna or probe which detects the A.C. or pulsed D.C. electrostatic field present around a non-shielded conductor. Since the passage of current through a conductor is required to set up an electromagnetic field, and since no current can pass through a broken conductor, an electromagnetic field detector is of no use in determining the location of the broken wire. The present inventive form of an electrostatic field detector provides means for easily locating the place of the break, since even in the absence of a flow of current, it has been found that the electrostatic field is continuous along the conductor but ceases at the location of the break.

Designs have previously been made for instruments used in detecting electrostatic fields. For instance, in Canadian Patent No. 1,012,607, dated June 21, 1977 a probe is described for detecting an electrostatic field which is hazardous to the human body. However, in this structure the human body must be in contact with the ground or common potential leads of the circuit for operation and there is no indicator as to the degree of hazard of the electrostatic field.

In the present invention, however, the structure operates without contact to a human, or to earth ground, and in the preferred form of the invention, a bar graph is formed by lamps lit in sequence to indicate in a graphical manner the relative strength of the electrostatic field. Accordingly, an operator using the present invention can estimate his distance from a live wire which he is seeking, whether or not it is carrying current, and by watching the number of lights which are lit, can trace the path of the wire and thus locate a break, blown fuse whether a switch is on or off, etc. As an example, a model of this invention typically can detect 110 volts A.C. at 25 cm, through a non-metallic wall.

Clearly the present invention is a substantially improved service instrument.

Furthermore, due to the absence of the requirement of a connection to ground, the antenna of the present invention can be connected to such structures as vehicle bodies. Accordingly, it can be used as a warning indicator within the cabin of a construction vehicle for indicating to the operator the distance of the vehicle from a dangerous high voltage line or the like. Once a predetermined distance has been passed, not only can there be a light indication, but also other warning indicators can be enabled, such as a tone generator, etc.

The inventive electrostatic field indicator instrument is comprised of, in general, an antenna, an amplifier having a high impedance input connected to the antenna, a low pass filter for blocking electrostatic field frequencies higher than the highest frequency of the field to be detected connected in a circuit path to the output of the operational amplifier, a lamp operation enabling circuit connected in a circuit path to the output of the low pass filter, and lamp indication means connected to the enabling circuit for indicating relative levels of electrostatic field strength.

A better understanding of the invention will be obtained by reference to the detailed description below and to the following drawings in which:

FIG. 1 is a perspective view of the inventive service instrument,

FIG. 2 is a block diagram of the basic form of the invention,

FIG. 3 is a schematic diagram of the basic form of the invention,

FIG. 4 is a schematic diagram of an alternate form of the basic form of the invention, FIG. 5 is a block schematic of the preferred form of the invention.

Figure 6:
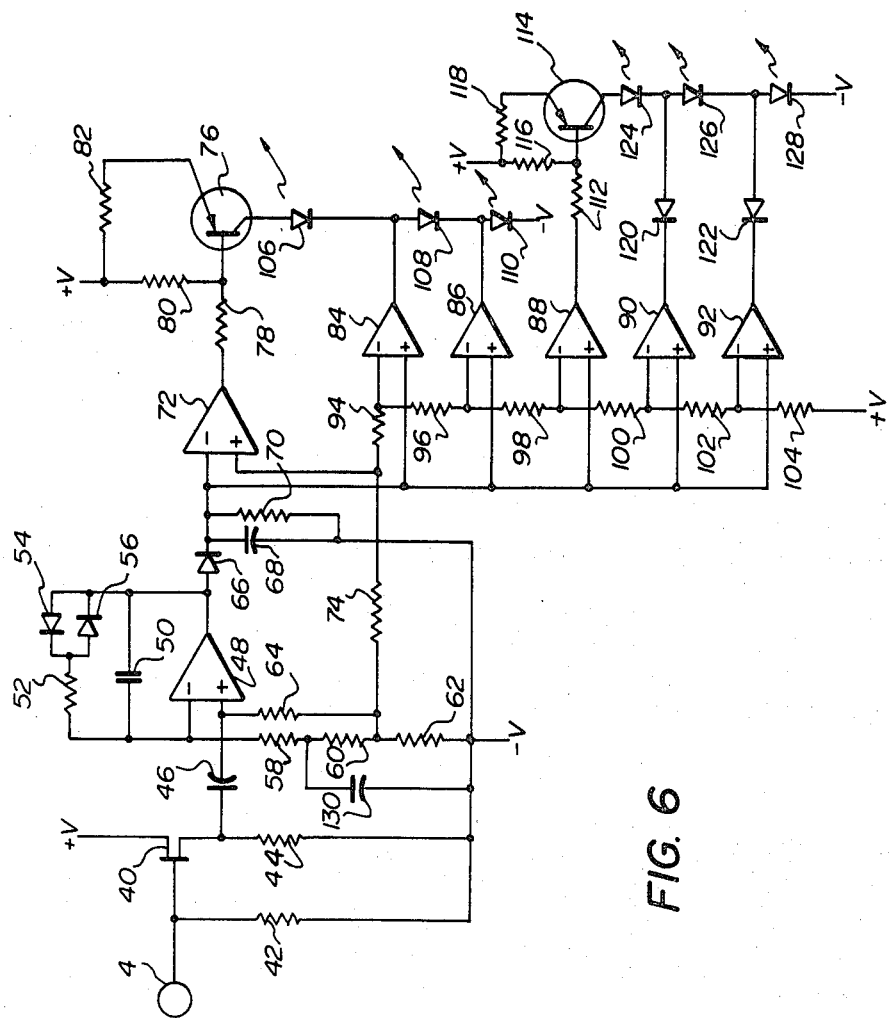
FIG. 6 is a detailed schematic of the preferred form of the invention.

Turning first to FIG. 1, the inventive circuit is housed in a non-conductive housing 2 which is preferably of size and shape suitable for holding in the hand of an unskilled operator. An antenna 4 is located at one end of the housing; the antenna is of predetermined size and shape to match the field to be detected, but typically can be a metallic disk of about ½" diameter. Alternatively it can be shaped so as to define or form the detection area. It is not required that the disk be exposed; it can be covered with an insulator. For instance, a suitable antenna is a disk capacitor of about ½" diameter having one or both leads connected to the input of the circuit to be described.

A row of lights 6 is located for viewing by the operator, along the side of the housing 2. The lights can of course be in locations alternate to the ones shown; for instance, the row can be orthogonal to the axis of the housing, the lights can be disposed around the periphery of part of a circle, etc. A threshold control 8 is located for easy adjustment of the instrument.

In use the housing is held by an operator (who may or may not be wearing insulating gloves), and the antenna 4 is pointed at the area in which the wire is expected. Alternatively the housing is rested at a location adjacent a conductor, while an operator operates remote switches observing the indicators on the housing. The knob of a threshold control 8 is turned to maximum sensitivity. The housing, if held, is scanned generally over the area and as soon as at least one of the lights 6 is noted by the operator as being illuminated, he attempts to increase the number of lights by locating the antenna housing in the best position. As the antenna 4 nears the wire, gradually more and more lights in the row will light. The threshold control 8 then is turned to a less sensitive position, as the antenna is brought nearer and nearer the more intense electrostatic field of the broken wire. Finally, the wire is located with the threshold control at a minimum sensitivity for the intensity of the electrostatic field (which is believed to be related to the voltage, the radius of the conductors, and the distance of the wire from the antenna).

It is believed clear that the operation of the inventive instrument can be done by a relatively unskilled worker. Further, the intensity of the field can be more accurately determined by calibration of the threshold control, for a known distance, although the relative intensity is easily discerned for a particular threshold by regarding the number of lights which are lit.

The circuit in its most basic form is shown in block diagram in FIG. 2. In this Figure antenna 4 is connected to a high impedance input, low pass amplifier. Since the instrument is mainly directed to a means for locating mains wires, and since mains currents are typically A.C. of 60 hertz frequency, it is desired to cut off detection of signals above, for instance, 10 kilohertz. The remaining bandwidth allows the detection of electrostatic field signals which are higher than 60 hertz caused for example by harmonics of two interactive remaining phases of a three phase 60 hertz system, the detection of a 400 hertz military power source with the harmonics, etc. Of course other cutoff frequencies than 10 kilohertz could be used if desired.

The output of amplifier 10 is connected to a lamp driver 12 which operates the indicator lamp. As this is the most basic form of the invention, a single lamp indicator is contemplated, but multiple lamp indicators will be described with reference to the preferred system of FIGS. 5 and 6. The lamp driver 12 preferably has a variable threshold of operation, controlled by the threshold control noted earlier. However in a multiple lamp system the dynamic range of the instrument is sufficient that the threshold control may be deleted.

FIG. 3 depicts a schematic diagram of the invention described with reference to FIG. 2.

Antenna 4 is connected to low pass active filter 14 having a cutoff frequency as aforenoted. The output of the active filter is connected to the input of transistor light driver 16. A lamp 18 is connected as a load in a circuit with the transistor to a source of power −V and +V.

An alternative circuit is shown in FIG. 4. Antenna 4 is connected to operational amplifier circuit 20 having a high input impedance. The output of operational amplifier 20 is connected through a detector diode 22 (which forms a peak detector) to a low pass filter comprising capacitor 24 and resistor 26 in parallel between the output of the diode and common. The output of the low pass filter is connected to the input of transistor light driver 16, which is connected with lamp 18 as described with reference to FIG. 3.

In FIG. 3 the operational amplifier is used as the active element in active filter 14. The antenna is connected to the operational amplifier 20 in a circuit path to the inverting input, with the non-inverting input connected to a negative common source of potential. Should it be desired to include the threshold control as aforenoted, the non-inverting input of the operational amplifier of FIGS. 3 and 4 are connected instead to a source of supply through a variable voltage divider, such as to a potentiometer connected across the supply by which the potential is selectable. In this case the operational amplifier will not pass current until the threshold has been exceeded, and accordingly, the circuit also acts as a peak detector, since only signals exceeding the threshold are passed and cause the lamp to operate.

In operation, an electrostatic field is received by antenna 4. This signal is passed to the input of the differential amplifier of the circuits of either FIG. 3 or 4. In FIG. 3, the differential amplifier is used in active filter 14, and accordingly only signals lower than the filter frequency, i.e. 10,000 hertz, is passed. In the circuit of FIG. 4, all signals are passed.

In the circuit of FIG. 3, the output signal is applied to the base of transistor 16, causing it to conduct and causing lamp 18 to operate.

In the circuit of FIG. 4, the signal is rectified in diode 22, and the rectified output signal is applied to the filter comprised of capacitor 24 and resistor 26. This signal is applied to transistor 16 which begins conduction and lamp 18 is illuminated.

Should the non-inverting input of the operational amplifier be connected to a potential higher than the common potential −V, the operational amplifier will not conduct until the signal received on the antenna exceeds the threshold. By varying the potential on the non-inverting input a varying threshold, and therefore a control of sensitivity is obtained. Accordingly, even with a single lamp, the sensitivity control can be used to closely locate the electrostatic field caused by a hidden wire or voltage source.

It should be noted that the amplifier used can be of a non linear transfer characteristic type, such as one with a logarithmic response. This structure has the advantage that it would be able to detect, say, 110 volts A.C. at 10 inches, with minimum readout and 10,000 volts A.C. such as automobile ignition voltage at the same distance with maximum readout.

FIG. 5 is a block diagram of the preferred form of the invention. Antenna 4 which may be comprised of conductor means 5 for electrical connection to the conductive body of a vehicle 7, is connected to the input of a high impedance buffer amplifier 28. The output of amplifier 28 is connected to an amplifier 30, the output of which is connected to a low pass filter 32. The output of low pass filter 32 is connected to peak detector 34 which in turn is connected to the input of a comparator circuit 36 which forms a light driver. The output of comparator 36 is connected to light array 38.

The electrostatic field signal is received on antenna 4 and is applied to the input of the high impedance buffer amplifier 28. This low level signal is amplified by amplifier 30 which preferably provides approximately 40 db gain to the signal. The signal then is passed through low pass filter 32 which cuts off all frequencies above 10,000 hertz. The resulting signal passes through peak detector 34, which allows all those signals to pass which are above a predetermined threshold, which threshold can be set either internally or externally. The output of peak detector 34 is applied to a comparator circuit 36, which causes illumination of one or more lamps in light array 38, depending upon the amplitude of the signal passing out of peak detector 34 (which of course is related to the intensity of the electrostatic field in excess of the selected threshold).

Turning now to FIG. 6, the preferred form of the invention is shown. Antenna 4 is connected to the input gate of field effect transistor 40. Field effect transistor 40 has an extremely high input impedance; its gate is bypassed by resistor 42 which is also high resistance, typically 4.7 megohms, for example.

Field effect transistor 40 is connected as a source follower with a source resistor 44 connected to common, which is connected to a negative source of potential −V. The source terminal is connected through an input capacitor 46 to the non-inverting input of operational amplifier 48. Operational amplifier 48 has its inverting input connected to its output through integrating capacitor 50, which is bypassed by the series circuit of resistor 52 with paralleled oppositely poled diodes 54 and 56. The inverting input of operational amplifier 48 is also connected to a source of potential −V through series resistors 58, 60 and 62. The non-inverting input of operational amplifier 48 is connected to the junction of resistors 60 and 62 through resistor 64.

The output of operational amplifier 48 is connected through diode 66 to a low pass filter comprising the parallel circuit of capacitor 68 and resistor 70, which are also connected to the common node −V.

The output of diode 66 is also connected to the inverting input of operational amplifier 72. The non-inverting input is connected through resistor 74 to the junction of resistors 60 and 62.

Clearly resistors 58, 60 and 62 provide a voltage divider which is connected to operational amplifier 48 through resistor 64 in such manner that a threshold of operation for amplifier 48 is established. Resistor 74 is of significantly smaller value than resistor 64, and therefore the same threshold is established for operational amplifier 72.

The output of operational amplifier 72 is connected to the base of transistor 76 via resistor 78. The base is also connected to the source of supply +V through resistor 80. As the transistor shown is of PNP type, its emitter is connected to the supply +V through resistor 82.

Connected in parallel with the inputs to operational amplifier 72 are comparators 84, 86, 88, and operational amplifiers 90 and 92, with the non-inverting inputs thereof connected directly to the inverting input of operational amplifier 52. However each of the inverting inputs is connected to taps of a voltage divider comprising resistors 62, 74, 94, 96, 98, 100, 102 and 104, which are connected in series between the non-inverting input of operational amplifier 72 and a source of potential +V.

Light emitting diode 106 is connected between the collector of transistor 76 and the output of comparator 84, light emitting diode 108 is connected between the outputs of comparators 84 and 86, and light emitting diode 110 is connected between the output of comparator 86 to common potential −V.

Comparator 88 has its output connected through resistor 112 to the base of transistor 114. The circuit is similar to the circuit involving operational amplifier 72 and transistor 76; resistor 116 is connected between the base of transistor 114 and a source of potential +V, and the emitter is connected through resistor 118 to a source of potential +V.

The output of operational amplifier 90 is connected to one terminal of diode 120, and operational amplifier 92 is connected to one terminal of diode 122.

Light emitting diode 124 is connected between the collector of transistor 114 and the second terminal of diode 120, light emitting diode 126 is connected between the junction of diodes 124 and 120 and the second terminal of diode 122, and light emitting diode 128 is connected between the junction between diodes 126 and 122 and common potential −V.

In operation, antenna 4 is placed within an electrostatic field, the source of which is to be detected. Field effect transistor 40 which has its gate bypassed by a high resistance, such as 4.7 megohms, presents a high impedance to the field. Being connected as a source follower, its output is at considerably lower impedance, and the resulting signal is applied through capacitor 46 to the input of operational amplifier 48.

Capacitor 50 provides an integration function of the input signal, and diodes 54 and 56 with resistor 52 provide a limiting action, to avoid overloading of the system in an excessively strong field and to compensate for the voltage drop across diode 66.

The voltage divider provided by resistors 58, 60 and 62 provides a dc bias point for setting a threshold of operation of the operational amplifiers, but is at common potential with respect to ground for ac signals due to the provision of bypass capacitor 130, which is connected between the junction of resistors 58 and 60 and common potential. Accordingly, signals which exceed the threshold provided by the voltage divider are translated in operational amplifier 48 and are applied to detecting diode 66. Yet signals exceeding a maximum established by the limiting diodes in the feedback path of operational amplifier 48 are limited in amplitude.

Signals between the lower threshold and to the upper maximum are rectified in detector diode 66 and are filtered to dc in capacitor 68 with resistor 70. These varying dc levels are applied in parallel to operational amplifiers 72, 90 and 92 and comparators 84, 86 and 88.

The lowest level signals applied to operational amplifier 72, exceeding the lower threshold are translated and are inverted in operational amplifier 72, so as to cause the output signal to drop in level. This causes a low level signal to be applied to the base of transistor 76 which is connected to the tap between the resistors 80 and 78 which form a voltage divider between a source of potential +V and the lower level output signal of operational amplifier 72. Accordingly, the emitter-collector circuit of transistor 76 is caused to become conductive, upon the presentation of a potential to its base which is lower than that of its emitter.

In the meantime, the threshold of operational amplifier 84 has not been exceeded. Since the input signal is applied to its inverting and non-inverting inputs in inverse polarity to that of operational amplifier 72, and since its threshold has not been exceeded, its output signal is at low level. Since the output impedance is low, a dc path exists through it to common potential. Accordingly a complete direct current circuit exists from the source of potential +V, through resistor 82, the emitter-collector circuit of transistor 76 and light emitting diode 106 to common potential. Light emitting diode 106 thereby is caused to illuminate.

Assuming that the electrostatic field is increased in intensity by antenna 4 being closer to its source, for example, the threshold of comparator 84 is thereby exceeded, since a larger proportion is applied thereto via the voltage divider comprising resistors 94-104. Accordingly the high level signal applied to its input is translated and changes the output level to high level. Accordingly the current path from diode 106 to the output of comparator 84 exists no longer, and the anode of diode 106 would otherwise go to high level.

However, the threshold of comparator 86 has not yet been exceeded, and since the equivalent of a low level input is applied thereto, its output is at low level. Accordingly a circuit path now exists from light emitting diode 106 through light emitting diode 108, to the output circuit of comparator 86 to common potential. Accordingly light emitting diode 106 and light emitting diode 108 illuminate. However light emitting diode 110 does not illuminate since the potential at its anode and cathode are approximately the same.

Assuming the intensity of the field increases further, the threshold of operation of comparator 86 is exceeded, and its output goes to high level. Accordingly the circuit path now existing comprises light emitting diode 106, light emitting diode 108 and also light emitting diode 110 to common potential −V, and, as before through the emitter-collector circuit of transistor 76, resistor 82 to source of potential +V. All three light emitting diodes are therefore illuminated.

It may be seen that with successively increasing electrostatic fields, first light emitting diode 106, then light emitting diode 108 and finally light emitting diode 110 are illuminated. Clearly an indication is provided to the operator as to how close the antenna of the instrument is to the source of the field as it is brought closer and closer.

The circuit involving comparator 88 and operational amplifiers 90 and 92 with transistor 114 and light emitting diodes 124, 126 and 128 operate in identical manner to those described above.

Should the potential +V have been sufficient, there would have been no need to use a circuit comprising transistor 114, and additional comparators and light emitting diodes could have been connected in a similar manner as comparators 84 and 86 with light emitting diodes 108 and 110, eventually reaching common potential. However, as in a portable instrument a convenient battery voltage to use is 9 volts, eventually there would be insufficient voltage available to operate a sufficient number of light emitting diodes to give the bar graph effect desired; typically 2 volts per light emitting diode is contemplated, and six light emitting diodes would have required 12 volts, an inconvenient battery supply. For that reason, two strings of three light emitting diodes each, with each string operated by a switched transistor 76 and 114 (each acting as a constant current source) is used from the same 9 volt battery supply.

It is also preferred to utilize diodes 120 and 122 in the output circuits of operational amplifiers 90 and 92. These provide the function, at relatively high input signal levels to ensure that the output levels upon the thresholds being reached are sufficiently high that a circuit is not found even with the thresholds being exceeded, through their output circuits. In other words, the output signals must be sufficiently high to back bias diodes 120 and 122 to ensure that current paths are not found through light emitting diode 124 to common through operational amplifier 90, or through light emitting diode 126 and diode 122 to common through operational amplifier 92, at improper voltage levels.

Elements 90 and 92 are operational amplifiers which can source current in the event diode 120 and 122 are not used.

It may be seen that as described before with reference to the operation of light emitting diodes 106, 108 and 110, diodes 124, 126 and 128 are caused to sequentially illuminate upon successively higher electrostatic fields being encountered, by antenna 4 being brought closer and closer to the source of the field, i.e. and energized (live) conductor. The levels at which each of the diodes are turned on can be varied by varying the resistance of the respective resistors in the voltage divider having resistors 94–104.

Accordingly a graphical bar chart comprising light emitting diodes 106, 108, 110, 124, 126 and 128 provide an indication to the operator as to the distance of the instrument from the source of the electrostatic field.

It should be noted that the intensity of the electrostatic field drops as the square of the distance from the source of the field. The successive illumination of the light emitting diodes would therefore be highly non-linear with distance from the source, except that the values of the resistors 94–104 are preferred to be chosen such that the threshold of conduction of each of the corresponding operational amplifiers are increased non-linearly, by the square of the signal voltage. This compensates for the square law field intensity and the result is a linear relationship of distance from the source and number of light emitting diodes illuminated.

It has been found that since the common point of the circuit is physically so small and so far removed from any major ground plane, the capacitance between that point and ground causes little effect on the sensitivity of the instrument should its case come into contact with a human operator or be in physical contact with a ground plane such as a conductive (or non-conductive) top of a workbench. Accordingly in contrast with prior art electrostatic field detectors there is no need to connect the internal ground or common to an external ground or to a person. Indeed, an operator would otherwise expect the common point to be connected to an automobile chassis, for example, to provide a ground plane, yet it has been found that the automobile chassis operates satisfactorily as an antenna, when connected to the antenna input 4 of the circuit. No external or other ground connections are required.

In addition, the overall sensitivity can be varied by varying the resistance of resistor 62, or the tap between resistors 60 and 62. These resistors can be made a potentiometer and the entire threshold of sensitivity of the instrument can be made variable.

It should also be noted that other forms of indicators can be used other than the light emitting diodes described. For instance, means can be provided for intensity modulation of the LED or lamp current of the circuits to indicate distance from the electrostatic field. A control circuit can be used to switch the LED or lamp current on and off at a rate which is dependent on input voltage, by which the flashing rate indicates relative distance from the source. A slowly flashing lamp indicates a great distance and a high rate of flashing (which at 15 flashes per second or higher can be interpreted as a steady illumination by the eye) indicates a close distance (or a high field level) to the electrostatic source. Audible indicators could be used, or combinations of intensity modulation, flashing, etc. Certain of the indicators could be used once a predetermined threshold has been exceeded, while others could be utilized below the threshold.

It may now become clear to a person skilled in the art understanding this invention that modifications, variations and other embodiments can be made, while using the principles of the present invention. All are considered within the sphere and scope of the invention as defined in the appended claims.

The embodiments of the invention in which an exclusive property or privilege is claimed are defined as follows:

1. An electrostatic field indicator instrument circuit comprising:
   (a) an amplifier having a high impedance input;
   (b) an antenna connected via a conductor, which is unshielded with respect to ground, to said input;
   (c) a low pass filter for blocking electrostatic field frequencies higher than the highest frequency of the field to be detected connected in a circuit path to the output of the amplifier;
   (d) a lamp operation enabling circuit connected in a circuit path to the output of the low pass filter; and
   (e) lamp indication means, connected between the poles of a battery and to said enabling circuit, for indicating particular levels of electrostatic field strength received by the antenna by comparing the output of said low pass filter with respectively-different potential levels representative of said particular levels of electrostatic field strength and generating respective indication signals in accordance therewith; and
   in which the entire circuit is isolated from connection to ground.

2. An electrostatic field indicator instrument circuit comprising:
   (a) an antenna having a conductor having means for electrical connection to the conductive body of a vehicle and which is unshielded with respect to ground,
   (b) a field effect transistor circuit having its gate connected in a high impedance circuit to the antenna,
   (c) an operational amplifier having its input connected in a source follower circuit to the output of the field effect transistor,
   (d) a diode detector and low pass filter circuit connected in a circuit path to the output of the operational amplifier,
   (e) a voltage comparator having a pair of inputs, one input being connected in a circuit path to the output of the low pass filter, the other input being connected to a battery for establishing a threshold of operation of the comparator, and
   (f) battery operated means enabled upon operation of the voltage comparator for providing an indication that a detected electrostatic field has exceeded a predetermined intensity established by the selected dc voltage in which the entire circuit is isolated from connection to ground; and further including
   a plurality of voltage comparators each having a pair of inputs, one input of each being connected to the output of the low pass filter, the other input of each being connected to individual taps of a voltage divider connected across a source of potential whereby individual successive thresholds of operation is provided for each voltage comparator, battery operated indicator means enabled by each of the voltage comparators for providing indication that a detected electrostatic field has exceeded the increasing thresholds of each successive voltage comparator to a particular threshold level.

3. An electrostatic field indicator instrument circuit as defined in claim 1 in which the amplifier is an operational amplifier further including diode detector means connected in the circuit path between the operational amplifier and the low pass filter.

4. An electrostatic field indicator instrument circuit as defined in claim 3 further including a field effect transistor circuit having its gate connected in a high impedance circuit to the antenna, and its output circuit connected to the input of the operational amplifier as a source follower.

5. An electrostatic field indicator instrument circuit as defined in claim 1 or 4 in which the lamp operation enabling circuit is comprised of a comparator having a pair of inputs, one connected in a circuit path to the output of the low pass filter and the other connected to a predetermined potential, whereby the lamp indicator means is caused to operate upon a signal on said one input exceeding the potential on said other input.

6. An electrostatic field indicator instrument circuit as defined in claim 4 in which the lamp operation enabling circuit is comprised of a plurality of comparators each having a pair of inputs, one of each of the inputs connected in common in a circuit path to the output of the low pass filter and each of said others connected to individual predetermined successively higher potential levels, further including individual lamp indicators connected in series between the poles of a battery supply and operatively to the outputs of respective ones of the comparators, whereby upon detection of an electrostatic field, each of the comparators detecting a signal higher than its corresponding said predetermined potential level is caused to operate a corresponding lamp, thus providing the illumination of a series of operated lamps and indicating the intensity of the electrostatic field.

7. An electrostatic field indicator instrument circuit as defined in claim 1 or 6 further including a threshold detector for passing electrostatic field signals higher in amplitude than a predetermined amplitude, connected in the circuit path to the input of the lamp operation emabling circuit.

8. An electrostatic field indicator instrument circuit as defined in claim 1 or 6, in which the antenna is comprised of a metal disk about ½" in diameter.

9. An electrostatic field indicator instrument circuit as defined in claim 1 or 6, in which the antenna is comprised of a conductor having means for electrical connection to the conductive body of a vehicle.

* * * * *